United States Patent
Zhang et al.

(10) Patent No.: US 6,619,537 B1
(45) Date of Patent: Sep. 16, 2003

(54) DIFFUSION BONDING OF COPPER SPUTTERING TARGETS TO BACKING PLATES USING NICKEL ALLOY INTERLAYERS

(75) Inventors: Hao Zhang, San Jose, CA (US); Jeff Hart, Columbus, OH (US); Ann Bolcavage, Indianapolis, IN (US)

(73) Assignee: Tosoh SMD, Inc., Grove City, OH (US)

( * ) Notice: Subject to any disclaimer, the term of this patent is extended or adjusted under 35 U.S.C. 154(b) by 0 days.

(21) Appl. No.: 09/879,543

(22) Filed: Jun. 12, 2001

Related U.S. Application Data
(60) Provisional application No. 60/210,953, filed on Jun. 12, 2000.

(51) Int. Cl.[7] .................. B23K 20/00; B23K 28/00; C25B 11/00; C25C 14/00
(52) U.S. Cl. ................ 228/194; 228/193; 204/298.12; 204/298.13
(58) Field of Search ................ 228/194, 193; 204/298.12–298.14, 192.15

(56) References Cited

U.S. PATENT DOCUMENTS

| | | | |
|---|---|---|---|
| 3,482,305 A | 12/1969 | Dockus et al. ............... 29/487 |
| 4,194,672 A | * 3/1980 | Uto et al. .................... 228/194 |
| 4,209,375 A | 6/1980 | Gates et al. ................. 204/192 |
| 4,341,816 A | * 7/1982 | Lauterbach et al. ... 204/192.15 |
| 4,476,151 A | 10/1984 | Keller et al. ................. 427/34 |
| 4,890,784 A | 1/1990 | Bampton ................... 228/194 |
| 5,066,381 A | 11/1991 | Ohta et al. ............. 204/298.12 |
| 5,143,590 A | 9/1992 | Strothers et al. ....... 204/298.12 |
| 5,230,459 A | 7/1993 | Mueller et al. ............. 228/164 |
| 5,234,487 A | 8/1993 | Wickersham, Jr. et al. ... 75/248 |
| 5,244,556 A | 9/1993 | Inoue .................... 204/192.12 |
| 5,322,740 A | 6/1994 | Ghosh ...................... 428/649 |
| 5,338,425 A | 8/1994 | Mishima et al. ....... 204/298.12 |
| 5,354,446 A | 10/1994 | Kida et al. ............. 204/298.22 |
| 5,428,882 A | 7/1995 | Makowiecki et al. ...... 29/527.5 |

(List continued on next page.)

FOREIGN PATENT DOCUMENTS

| EP | 0590904 A1 | 9/1993 |
|---|---|---|
| WO | 9319220 | 9/1993 |
| WO | 9826107 | 6/1998 |
| WO | 9841669 | 9/1998 |

OTHER PUBLICATIONS

U.S. patent application Ser. No. 09/226,678, Bolcavage et al., filed Jan. 7, 1999, Title: Diffusion Bonding Of High Purity Metals And Metal Alloys To Aluminum Backing Plates Using Nickel Or Nickel Alloy Interlayers.

U.S. patent application Ser. No. 09/868,407, Zhang, filed Jun. 14, 2001, Title: Diffusion Bonded Sputter Target Assembly And Method Of Making Same.

*Primary Examiner*—Tom Dunn
*Assistant Examiner*—L. Edmondson
(74) *Attorney, Agent, or Firm*—Wegman, Hessler & Vanderburg

(57) ABSTRACT

A sputter target assembly including a high purity copper sputter target diffusion bonded to a backing plate, preferably composed of either aluminum, aluminum alloy, aluminum matrix composite materials, copper, or copper alloy, and a Ni-alloy interlayer, preferably composed of Ni—V, Ni—Ti, Ni—Cr, or Ni—Si, located between and joining the target and backing plate, and a method for making the assembly. The method of making involves depositing (e.g., electroplating, sputtering, plasma spraying) the interlayer on a mating surface of either the sputter target or backing plate and pressing, such as hot isostatically pressing, the sputter target and backing plate together along mating surfaces so as to form a diffusion bonded sputter target assembly.

10 Claims, 4 Drawing Sheets

U.S. PATENT DOCUMENTS

| | | | |
|---|---|---|---|
| 5,593,082 A | 1/1997 | Ivanov et al. | 228/122.1 |
| 5,642,853 A | 7/1997 | Lee | 228/127 |
| 5,653,856 A | 8/1997 | Ivanov et al. | 204/192.12 |
| 5,693,203 A * | 12/1997 | Ohhashi et al. | 204/298.12 |
| 5,803,342 A | 9/1998 | Kardokus | 228/173.2 |
| 5,904,966 A | 5/1999 | Lippens | 428/36.91 |
| 5,965,278 A * | 10/1999 | Finley et al. | 204/298.13 |
| 6,071,389 A * | 6/2000 | Zhang | 204/298.12 |
| 6,073,830 A * | 6/2000 | Hunt et al. | 228/164 |
| 6,164,519 A * | 12/2000 | Gilman et al. | 228/107 |
| 6,199,259 B1 * | 3/2001 | Demaray et al. | 204/298.12 |
| 6,274,015 B1 * | 8/2001 | Beier et al. | 148/415 |
| 6,331,234 B1 * | 12/2001 | Kardokus et al. | 228/194 |
| 6,376,281 B1 * | 4/2002 | Kohler et al. | 438/118 |
| 2002/0003010 A1 * | 1/2002 | Shah et al. | 204/298.13 |

* cited by examiner

DIFFUSION BONDING OF COPPER SPUTTERING TARGETS TO BACKING PLATES USING NICKEL ALLOY INTERLAYERS

CROSS-REFERENCE TO RELATED APPLICATION

The benefit of prior U.S. Provisional Application No. 60/210,953, filed Jun. 12, 2000 is hereby claimed.

FIELD OF THE INVENTION

The present invention relates to a method for preparing sputter target/backing plate assemblies, and to the target/backing plate assemblies prepared therefrom. More particularly, the invention pertains to methods for diffusion bonding copper sputter targets to associated backing plates, preferably composed of aluminum, aluminum alloy, aluminum matrix composite material, copper, or copper alloys, using nickel-alloy interlayers and to assemblies produced thereby.

BACKGROUND OF THE INVENTION

Cathodic sputtering is widely used for depositing thin layers or films of materials from sputter targets onto desired substrates. Basically, a cathode assembly including the sputter target is placed together with an anode in a chamber filled with an inert gas, preferably argon. The desired substrate is positioned in the chamber near the anode with a receiving surface oriented normally to a path between the cathode assembly and the anode. A high voltage electric field is applied across the cathode assembly and the anode.

Electrons ejected from the cathode assembly ionize the inert gas. The electrical field then propels positively charged ions of the inert gas against a sputtering surface of the sputter target. Material dislodged from the sputter target by the ion bombardment traverses the chamber and deposits to form the thin layer or film on the receiving surface of the substrate.

In so-called magnetron sputtering, a magnet is positioned behind the cathode assembly to generate an arch-shaped magnetic field. The arch-shaped field, formed in a closed loop configuration over the sputtering surface of the sputter target, serves to trap electrons in annular regions adjacent the sputtering surface. The increased concentrations of electrons in the annular regions adjacent the sputtering surface promote the ionization of the inert gas in those regions and increase the frequency with which the gas ions strike the sputtering surface beneath those regions.

The sputter target is heated during the sputtering process by the thermal energy of the bombarding gas ions. This heat is dissipated by heat exchange with a cooling fluid typically circulated beneath or around a backing plate which is bonded to the sputter target along an interface opposite the sputtering surface.

With respect to sputter target assemblies used during sputtering processes, more specifically to copper target assemblies, these assemblies historically have been made by bonding a high-purity Cu plate to a lightweight and highly heat conductive backing plate, such as Al, aluminum alloy, or aluminum matrix composite materials. Additionally, Cu targets may be bonded to a Cu, or Cu alloy, backing plate in forming target assemblies. Two methods used in bonding Cu targets are solder bonding and diffusion bonding.

Solder bonds typically tend to produce relatively low bond strengths. More specifically, solder bonding between a Cu target and an Al backing plate only produces up to 4,000 psi (28 Mpa) bond strength with bond strength decreasing as the temperature of the target assembly increases during sputtering. In addition, typical solder bonding has low melting point and high vapor pressure elements that are a potential source for contamination in a sputtering chamber during sputter deposition. Therefore, diffusion bonding is preferred.

However, the bond between a Cu target and backing plates formed of various metallic materials may produce very brittle intermetallic compounds during the bonding process resulting in a weak bond. Specifically, the bond between Cu and Al produced by diffusion bonding is extremely weak due to the fact that Cu and Al form several very brittle intermetallic compounds during the bonding process. These brittle interphases tend to reduce the mechanical load necessary to initiate failure during tensile testing, for example, copper and aluminum are capable of forming a low temperature intermetallic phase incapable of withstanding a tensile stress greater than approximately 2 ksi ($1.4 \times 10^7$ N/m$^2$).

To eliminate this intermetallic interphase and improve bond strength, it is necessary to use an interlayer, such as Ni or Ti, between the target and backing plate.

Nickel has been used previously as an interlayer to eliminate the intermetallic interphase. The use of Ni interlayers eliminates the intermetallic phase between target and backing plate thereby significantly improving bond strengths especially between copper sputter targets and aluminum backing plates.

Notably, Ni interlayers may be prepared by sputter deposition. However, sputter deposition of a Ni interlayer is difficult because Ni is a highly ferromagnetic material. Accordingly, usage of pure Ni results in low magnetic flux intensity in front of the target surface because a considerable portion of magnetic flux from system magnets is shunted by the target. Magnetic targets cannot be efficiently sputtered, nor plasmas be ignited, if there is not sufficient magnetic flux intensity in front of the targets.

A Ni-alloy interlayer can be used to achieve higher magnetic flux intensity and improved magnetic flux distribution over pure Ni interlayers. Specifically, alloying Ni with V, Ti, Cr, and Si can reduce the magnetic permeability of Ni. Using such Ni-alloy interlayers significantly increases the deposition rate and allows the use of thicker targets in production. Thicker targets require less frequent target replacement resulting in decreased tool down time and increased productivity. Also, layer uniformity is improved which increases bonding quality and strength. Lastly, a fine grain and preferred crystallographic texture in the bonded Cu target is retained.

Accordingly, there remains a need in the art for a sputter target assembly comprising a high purity copper sputter target, a metallic backing plate, preferably composed of aluminum, aluminum alloy, aluminum matrix composite material, copper, or copper alloys, and a Ni-alloy interlayer having a high bond strength and no intermetallic phase between target and backing plate, and a method of making same.

SUMMARY OF THE INVENTION

The present invention provides a sputter target/backing plate assembly comprising a sputter target composed of copper and alloys thereof, most preferably high-purity copper, a backing plate composed of a metallic material, preferably aluminum, aluminum alloy, aluminum matrix composite materials, copper, or copper alloys, and an interlayer between the target and backing plate wherein the interlayer, target, and backing plate are diffusion bonded together. The interlayer is composed of a Ni-alloy, preferably Ni—V, Ni—Ti, Ni—Cr, and Ni—Si.

With respect to the target assembly, higher magnetic flux intensity and improved magnetic flux distribution can be achieved by using a Ni-alloy target. Alloying Ni with V, Ti, Cr, and Si can reduce the magnetic permeability of Ni. Also, using such Ni-alloy interlayers significantly increases the deposition rate and allows the use of thicker targets in production. Thicker targets require less frequent target replacement resulting in decreased tool down time and increased productivity. Lastly, layer uniformity is improved which increases bonding quality and strength.

The method of making the sputter target/backing plate assembly of the present invention includes depositing, preferably by means of electroplating, sputtering, or plasma spraying, the interlayer on one of the mating surfaces of the target or backing plate. The mating surface of either the sputter target or the backing plate preferably is roughened to form a plurality of salient portions projecting therefrom. The mating surfaces must be carefully cleaned prior to deposition of the interlayer. After deposition, the sputter target and backing plate are pressed together along the mating surfaces. The sputter target and the backing plate are held in contact at a temperature just below the melting points of the sputter target and backing plate materials to promote diffusion bonding. In a preferred method of making, the target, interlayer, and backing plate are HIPped together in a HIP can.

In an especially preferred form of the invention, the mating surface on the harder of the sputter target or the backing plate is roughened by machining a series of concentric grooves therein. The grooved mating surface is covered by a nickel-alloy layer having a consistent thickness, preferably of approximately 1 to 100 microns. The sputter target and the backing plate are then joined along the mating surfaces using hot isostatic pressing. The process results in a fully joined assembly wherein the sputter target material is bonded in situ to the backing plate material through the medium of the nickel-alloy interlayer.

Preferably, the nickel-alloy interlayer is of sufficient thickness that the sputter target and the backing plate form substantially separate metallurgical bonds therewith; that is, the assembly forms two relatively strong intermetallic phases, including a first intermetallic phase between the nickel-alloy and the backing plate and a second intermetallic phase between the nickel-alloy and the copper of the sputter target, rather than a single, relatively brittle intermetallic phase between the sputter target and backing plate materials themselves.

Typically, the high purity metal or metal alloy of the sputter target will be harder than the metallic material of the backing plate. When the grooves and the nickel-alloy interlayer are formed on a mating surface of a sputter target formed of a metallic material harder than the metallic material from which the backing plate is composed, the jagged salient portions or ridges defined between the grooves serve to puncture the native oxide on the aluminum backing plate. The sides of the grooves provide additional surface area across which the metallic material from the backing plate diffuses to form a thick, yet strong, intermetallic phase.

The disruption of the mating surfaces caused by the pressing of the roughened surface against a substantially planar mating surface is believed to provide additional mechanical advantages. It is believed that the non-planar interface between the sputter target and backing plate portion of the completed assembly increases the resistance of the bond to shear failure. Furthermore, it is believed that the salient portions defined by the grooves fold over during the pressure consolidation of the assembly to form a locking type mechanism.

Whether on the mating surface of the sputter target or of the backing plate, the roughening provides the added advantage of facilitating the deposit of the nickel-alloy interlayer through the removal or disruption of any oxide layer formed on that surface.

The invention will be further described in the following description, the accompanying drawings and the appended claims.

DETAILED DESCRIPTION OF THE PREFERRED EMBODIMENT

Figure 1:
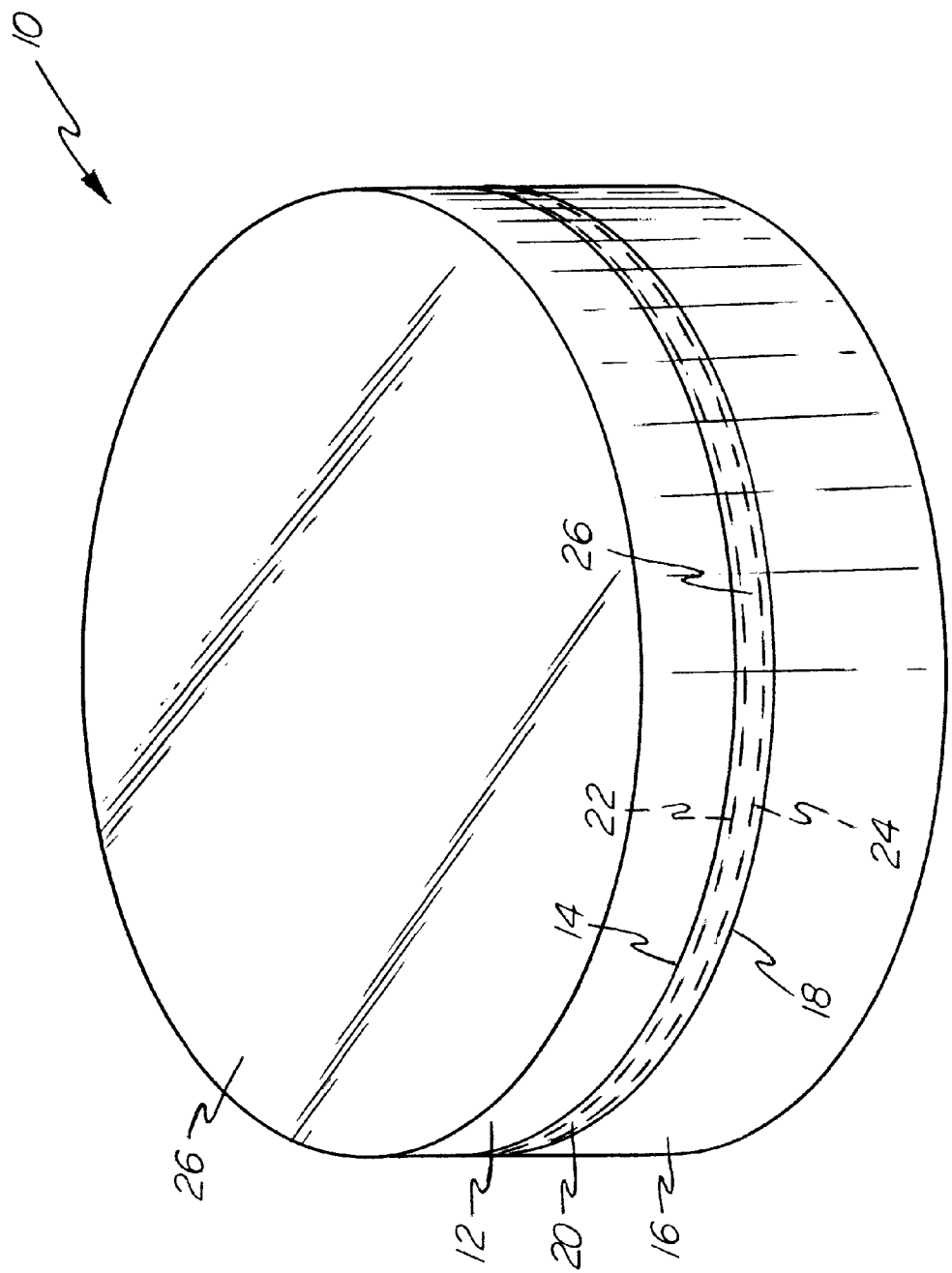
FIG. 1 shows a sputter target assembly made in accordance with the present invention.

Referring to FIG. 1, a sputter target assembly 10 includes a target 12 defining a first mating surface 14, a backing plate 16 defining a second mating surface 18, and an interlayer 20 between the first and second mating surfaces 14, 18 wherein the interlayer 20, target 12, and backing plate 16 are diffusion bonded together.

The target plate 12 comprises copper or a copper alloy, preferably high-purity copper, such as 5N or 6N copper. The backing plate 16 comprises a metallic material preferably aluminum, aluminum alloy, aluminum matrix composite materials, copper, or copper alloy, most preferably Al 6061. And, the interlayer 20 is made of a Ni-alloy, preferably Ni—V, Ni—Ti, Ni—Cr, or Ni—Si, most preferably Ni-7V. The interlayer 20 preferably has a thickness of about 1 to 100 microns. Notably, these target assemblies 10 with Ni-alloy interlayers 20 have high magnetic flux intensity and good magnetic flux, as well as good deposition rates allowing for the use of thicker targets in production. Lastly, the Ni-alloy interlayers 20 provide an interlayer uniformity that increases bonding quality and strength.

The bonds between the target 12 and the interlayer 20, and the interlayer 20 and the backing plate 16, are of the interdiffusion type wherein the target plate 12 is joined to the interlayer 20, and the interlayer 20 is joined to the backing plate 16.

The interface between the target 12 and the interlayer 20 defines a first intermediate portion 22 which is thought to comprise an intermetallic phase including copper or copper alloy and Ni-alloy. The interface between the interlayer 20 and the backing plate 16 defines a second intermediate portion 24 which is thought to comprise an intermetallic phase including Ni-alloy and a metallic material. Depending on the thickness of the interlayer 20, an interlayer portion 26 composed primarily of Ni-alloy may lie between the first and second intermediate portions 22,24. As shown, the sputter target assembly 10 includes a relatively planar surface 26 from which sputtering material is to be ejected to coat a desired substrate during the sputtering process.

Figure 2:
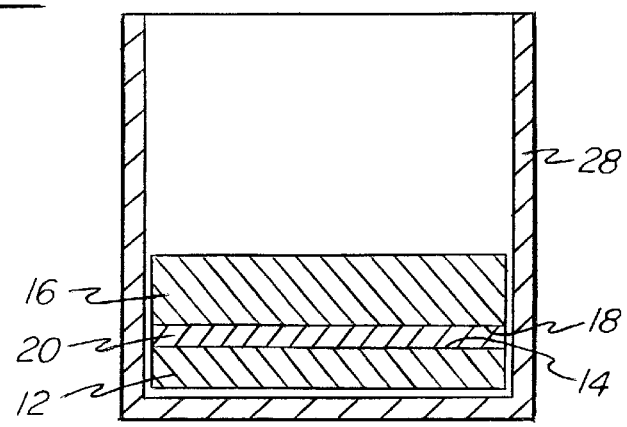
FIGS. 2–4 diagrammatically illustrate a series of steps performed in accordance with the invention for making the sputter target assembly of FIG. 1.
Figure 3:
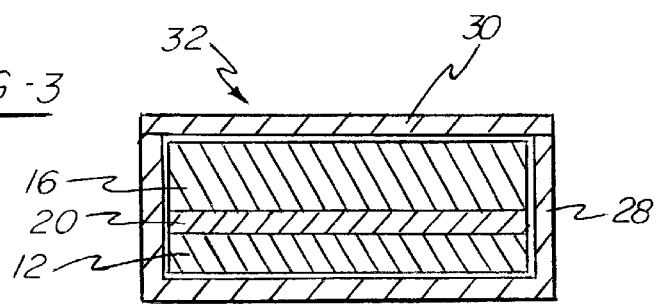
Figure 4:
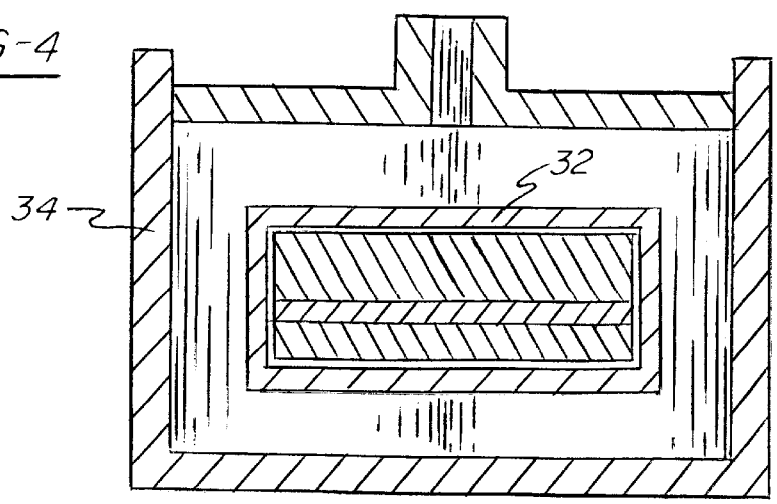

With reference to FIGS. 2–4, a preferred method of making the sputter target assembly 10 of the present invention comprises diffusion bonding the target 12, interlayer 20, and backing plate 16 by hot isostatic pressing (HIPing) the assembled target within a HIP can assembly 32 (FIG. 3). HIPing methods are described in more detail in U.S. Pat. No. 5,234,487, issued to Wickersham et al., and U.S. Pat. No. 5,230,459, issued to Mueller et al., the disclosures of which are incorporated herein by reference.

With respect to the method of making, FIG. 2 shows the target plate 12, preferably comprising copper or alloys thereof, most preferably high-purity copper, such as 5N and 6N copper, having a freshly machined and carefully cleaned flat first mating surface 14 facing upwardly within HIP can 28. The target plate 12 then is overlaid with the interlayer 20 comprising a Ni-alloy, preferably Ni—V, Ni—Ti, Ni—Cr, or Ni—Si, most preferably Ni-7V. The interlayer 20 can be deposited onto the target plate 12 by conventional methods such as electroplating, sputtering, or plasma spraying and preferably is about 1 to 100 microns thick, but may be of other thicknesses provided that it is sufficiently thick so that strong metallic bonds will form between the target 12 and the interlayer 20, and between the interlayer 20 and a backing plate 16.

The interlayer 20 is then overlaid with the backing plate 16 made of a metallic material preferably aluminum, aluminum alloy, aluminum matrix composite materials, copper, or copper alloy, most preferably Al 6061, and which preferably includes a freshly machined and carefully cleaned flat second mating surface 18 facing downwardly within the can 28. Accordingly, the artisan will appreciate that the interlayer 20 could be deposited onto a backing plate 16 and the target 12 overlaid on the interlayer 20.

After the target 12, the interlayer 20, and the backing plate 16 are placed in the can 28, a top closure plate 30 is welded onto the can 28 to form a can assembly 32 defining a vacuum tight closure, as shown in FIG. 3. Further, residual air is removed from the interior of the can assembly 32 through a tube (not shown) attached thereto.

Next, the can assembly 32 is placed in a HIP chamber 34 as shown in FIG. 4 and is subjected to a HIP process at a predetermined temperature and pressure for a selected time period. The can assembly 32 is typically subjected to equal pressure from all sides by means of a pressurizing gas, usually argon. The particular conditions used for the HIP process are selected to meet the requirements necessary to achieve sound bonds between the target 12 and the interlayer 20, and between the interlayer 20 and the backing plate 16.

In a preferred HIP process, an interlayer 20 comprising Ni-7V is deposited onto the first mating surface 14 of a target 12 comprising Cu, and the second mating surface 18 of a backing plate 16 comprising Al 6061 is laid on the interlayer 20. The sputter target assembly structure is placed into the HIP can assembly 32 and subjected to a temperature of about 350° C. and a pressure of about 15 ksi for a time period of about three hours inside a HIP chamber 34. Bonds having bond strengths as great as about 10,000 psi (69 MPa) are formed between the target 12 and backing plate 16. Such bond strength is equivalent to using pure Ni as an interlayer. Also, the target assembly has a fine grain and preferred crystallographic texture.

After the HIP process has been completed, the sputter target assembly 10 may be pressed and machined if desired by conventional means to desired dimensions.

Figure 5:
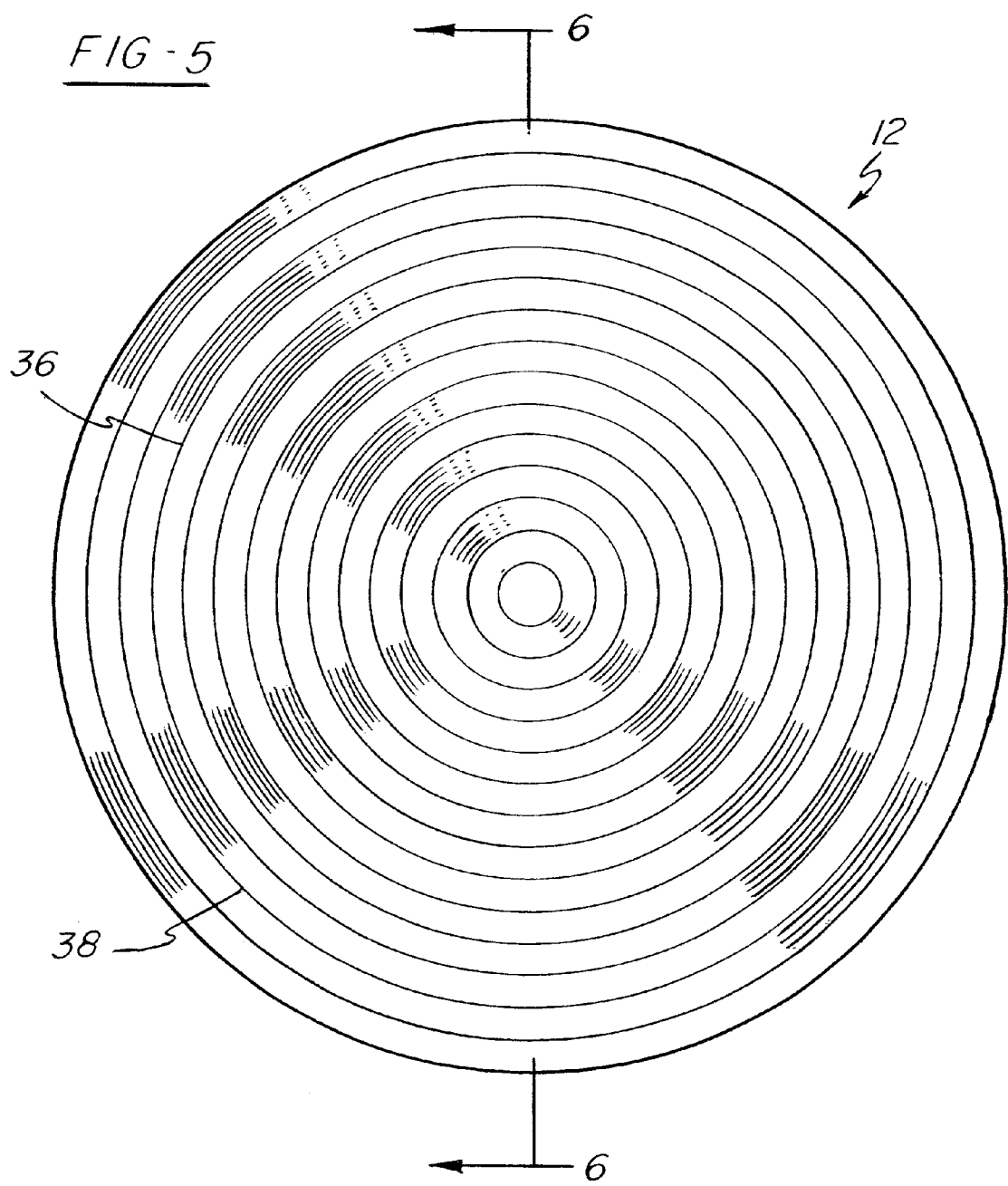
FIG. 5 is a bottom plan view of an alternative embodiment of a sputter target made in accordance with the invention.
Figure 6:
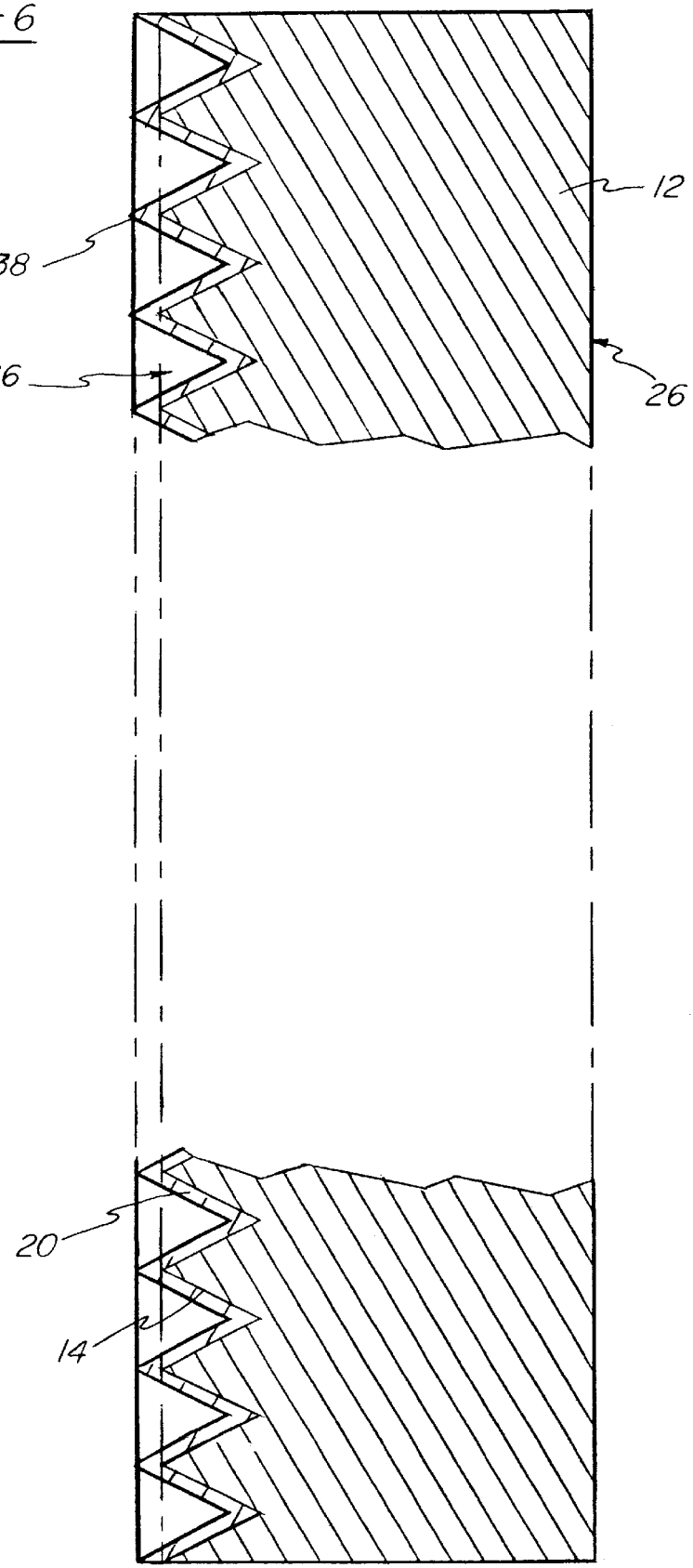
FIG. 6 is a cross-sectional elevational view of the sputter target of FIG. 5.

FIGS. 5 and 6 show another embodiment of the invention wherein one of the mating surfaces 14, 18 of either the target 12 or the backing plate 18 may be roughened such as by machining. More specifically, a target 12 is provided with a plurality of annularly-shaped grooves 36 machined therein defining jagged V-shaped projections or ridges 38 therebetween. The grooves 36 are concentrically arranged and are approximately 0.010 to 0.020 inch (0.25 to 0.50 mm) deep, preferably about 0.010 inch (0.25 mm) deep. FIG. 6 further illustrates the first mating surface 14 of the target 12 being overlaid with an interlayer 20.

While the invention is not limited to the use of concentric circular grooves 36 such as those shown in FIGS. 5 and 6, the use of concentric grooves 36 forming closed or endless loops is preferred because any oxygen trapped in the metal surface will be impeded from migrating out of the surface during the sputtering operation. Such migration might contaminate the sputtering chamber (not shown) and could lead to the formation of impurities on the sputter-coated substrate (not shown). The use of concentric circular grooves are especially preferred in that they are relatively easy to machine as compared to more complicated curves or figures.

Also, while the sputter target 12 shown in the figures is circular in cross-section, the invention is equally applicable to the fabrication of sputter target assemblies 10 from sputter targets 12 having rectangular or other cross-sectional shapes. Likewise, while the sputtering surfaces 26 of the sputter targets 18 are shown as planar, the technique of the invention is equally applicable to forming sputter target assemblies 10 having different contours. One example of a sputter target assembly structure to which the method of the present invention may be applied is shown in FIGS. 4 and 5 of the aforementioned U.S. Pat. No. 5,230,459 to Mueller et al.

Additionally, although the invention has been described as utilizing a HIPing process for pressure consolidation of the assembly, the artisan will appreciate that such consolidation could be effected for example by a vacuum hot pressing operation in which a preheated target, interlayer, and backing plate combination is placed in a vacuum chamber and then pressed to promote bonding.

While the method described herein and the sputter target/backing plate assemblies produced in accordance with the method constitute preferred embodiments of the invention, it is to be understood that the invention is not limited to these precise methods and sputter target/backing plate assembly structures, and that changes may be made in either without departing from the scope of the invention, which is defined in the appended claims. It is also to be kept in mind that reference to a metal or metal component herein also includes reference to alloyed forms of the stated metal.

What is claimed is:

1. A method of making a sputter target/backing plate assembly comprising:
   a) providing a sputter target comprising a high-purity copper and alloys thereof and defining a first mating surface;
   b) providing a backing plate composed of a metallic material selected from the group consisting of aluminum, aluminum alloy, and aluminum matrix composite materials and defining a second mating surface;
   c) depositing an interlayer on one of said first and second mating surfaces, said layer composed of Ni—V; and
   d) pressing said sputter target and said backing plate together along first and second mating surfaces so as to form a diffusion bond along said first and second mating surfaces.

2. The method as recited in claim 1 wherein said high purity copper is selected from the group consisting of 5N and 6N copper.

3. The method as recited in claim 1 wherein said aluminum is Al 6061.

4. The method as recited in claim 1 wherein said Ni—V is Ni-7V.

5. The method as recited in claim 1 wherein said step d) is carried out by hot isostatic pressing.

6. The method as recited in claim 1 wherein said hot isostatic pressing comprises pressing at 350° C. and 15 ksi for 3 hours.

7. A sputter target/backing plate assembly comprising:

a sputter target comprising high-purity copper and alloys thereof and defining a first mating surface;

a backing plate comprising a metallic material selected from the group consisting of aluminum, aluminum alloy, aluminum matrix composite materials and defining a second mating surface;

an interlayer comprising Ni—V between said first and second mating surfaces; and wherein said target, said interlayer, and said backing plate are diffusion bonded together.

8. The sputter target/backing plate assembly as recited in claim 7 wherein said high-purity copper is selected from the group consisting of 5N and 6N copper.

9. The sputter target/backing plate assembly as recited in claim 7 wherein said aluminum is Al 6061.

10. The sputter target/backing plate assembly as recited in claim 7 wherein said Ni—V is Ni-7V.

* * * * *